(12) United States Patent  
Chih-Peng

(10) Patent No.: US 6,270,620 B1  
(45) Date of Patent: Aug. 7, 2001

(54) ETCHING DEVICE

(75) Inventor: Fan Chih-Peng, Taipei Hsien (TW)

(73) Assignee: World Wiser Electronics Inc., Taoyuan Hsien (TW)

( * ) Notice: Subject to any disclaimer, the term of this patent is extended or adjusted under 35 U.S.C. 154(b) by 0 days.

(21) Appl. No.: 09/395,785

(22) Filed: Sep. 14, 1999

(51) Int. Cl.[7] .............................. B08B 1/02; B08B 9/20; D06B 3/02

(52) U.S. Cl. .................. 156/345; 134/122 R; 134/64 R; 15/77

(58) Field of Search ................ 134/122 R, 199, 134/64 R; 156/345

(56) References Cited

U.S. PATENT DOCUMENTS

| | | | |
|---|---|---|---|
| 4,999,079 | * 3/1991 | Ash | 216/91 |
| 5,007,968 | * 4/1991 | Coffman et al. | 134/25.4 |
| 5,043,022 | * 8/1991 | Kosters et al. | 134/3 |
| 5,335,681 | * 8/1994 | Schmid | 134/64 R |
| 5,553,633 | * 9/1996 | Ciccarelli, Jr. et al. | 134/72 |
| 5,862,820 | * 1/1999 | Kageyama et al. | 134/64 R |
| 6,216,304 | * 4/2001 | Hotani | 15/77 |

* cited by examiner

Primary Examiner—Gregory Mills  
Assistant Examiner—Sylvia R. MacArthur  
(74) Attorney, Agent, or Firm—Jiawei Huang; J. C. Patents

(57) ABSTRACT

An etching device capable of forming a uniform etchant film. The etching device is disposed on a plurality of parallel and coplanar hollow sheet-type rollers used to support a double-sided board. A plurality of first etchant nozzles is disposed under the hollow sheet-type rollers. The device has several solid rollers, several rows of second etchant nozzles and several rows of air nozzles. The solid rollers are coplanarly disposed over the hollow sheet-type rollers and are parallel to each other. The adjacent solid rollers comprise an interval, and the intervals are divided into several first intervals and several second intervals. The solid rollers touch the double-sided board to make an etchant film covering the double-sided board more uniform. The rows of second etchant nozzles are disposed over the first intervals and parallel to axes of the solid rollers. The rows of air nozzles are disposed over the second intervals and parallel to the axes of the solid rollers.

18 Claims, 5 Drawing Sheets

ETCHING DEVICE

BACKGROUND OF THE INVENTION

1. Field of Invention

The present invention relates to an etching device. More particularly, the present invention relates to an etching device capable of forming an uniform etchant film.

2. Description of Related Art

Typically, the laminate substrate used to manufacture a printed circuit board is formed by pressing together several doable-sided boards. The double-sided board comprises alternating layers of an insulating layer and two circuit layers. The method of respectively forming the circuit layers on each side of the insulating layer comprises the steps of forming a copper layer on each side of the insulating layer, and then patterning the copper layers by a photolithography process and an etching process to form a circuit layer on each side of the insulating layer, respectively.

FIG. 1A is a schematic, top view of a double-sided board when copper layers on both sides of the insulating layer are converted into circuit layers by using a conventional etching device. FIG. 1B is a cross-sectional view along a line I—I in FIG. 1A.

As shown in FIG. 1A together with FIG. 1B, a double-sided board 104 constituting alternating layers of an insulating layer 100 and copper layers 102a and 102b is provided. After performing a photolithography process, a wet etching process is performed to pattern the copper layers 102a and 102b. In the wet etching process, the double-sided board 104 is supported by several hollow sheet-type rollers 106b and contacts the hollow sheet-type rollers 106b through the copper layer 102b (as shown in FIG. 1A). While the wet etching process is performed, the hollow sheet-type rollers 106b are driven to roll by axles 106a and the double-sided board 104 levelly moves in a direction indicated by an arrow 110. Additionally, nozzles 114 spray etchant 108a onto the copper layers 102a and 102b. The etchant 108a is conically sprayed from the nozzles 114 in a swing fashion at a fixed point or in a to-and-fro horizontally fashion onto the copper layers 102a and 102b. Aternatively, the etchant 108a is sprayed from angled nozzles (not shown) in a swing fashion at a fixed point or in a to-and-fro horizontally fashion onto the copper layers 102a and 102b. Therefore, a lot of liquid 108b corresponding to the nozzles 114 is formed on the copper layer 102a to perform the wet etching process.

However, the etchant easily agglomerates to form a nonuniform etchant film 112 on the copper layer 102a, such that the thickness of the nonuniform etchant film 112 on the margin of the double-sided board 104 is larger than that in the center of the double-sided board 104. The appearance is called a fountain effect. Since thickness of the etchant film is nonuniform, the etching rate in the margin region of the double-sided board 104 is different from that of the central region of the double-sided board 104.

FIG. 2 is a contour diagram of the copper layer 102a after the etching process is performed. Obviously, the etchant film 112 in the central region of the double-sided board 104 is relatively thick, so that the etchant used in the central region of the double-sided board is not easily refreshed. Therefore, the etching result in the central region of the double-sided board 104 is relatively poor. Nevertheless, the etchant film 112 in the margin region of the double-sided board 104 is relatively thin, so that the etchant in the margin region of the double-sided board is often fresh. Hence, the etching result in the margin region of the double-sided board 104 is relatively good. Altogether, the thickness of the copper layer 102a in the central region of the double-sided board 104 is larger than that in the margin region of the double-sided board 104.

Conventionally, in order to move the double-sided board 104 along the direction indicated by arrow 110 more easily, several hollow sheet-type rollers 120 (as shown in FIG. 3) are disposed on the copper layer 102a. But the relative motion between the hollow sheet-type rollers 120 and the double-sided board 104 disrupts the flux of the etchant. Therefore, the etchant film is still nonuniform and the etching result of the copper layer 102a is still poor.

Additionally, in order to overcome the problem due to the fountain effect, another conventional etching device is provided, where the etchant is sectorially sprayed with a particular angle onto the double-sided board. Therefore, the etchant on the copper layer agglomerates to form an etchant flax. Moreover, several hollow sheet-type rollers are disposed on the double-sided board to assist the motion of the double-sided board (the cross-section of the device described above is similar to FIG. 3). However, the relative motion between the hollow sheet-type rollers and the double-sided board disrupts the flux of the etchant. Hence, the thickness of the etchant film is still nonuniform.

SUMMARY OF THE INVENTION

The invention provides an etching device capable of forming a uniform etchant film. The etching device is disposed on a plurality of parallel and coplanar hollow sheet-type rollers used to support a double-sided board, wherein a plurality of first etchant nozzles is disposed under the hollow sheet-type rollers. The device comprises several solid rollers, several rows of second etchant nozzles and several rows of air nozzles. The solid rollers are coplanarly disposed over the hollow sheet-type rollers and are parallel to each other. The adjacent solid rollers comprise an interval, and the intervals are divided into several first intervals and several second intervals. The solid rollers touch the double-sided board to make an etchant film covering the double-sided board more uniform. The rows of second etchant nozzles are disposed over the first intervals and parallel to axes of the solid rollers. The rows of air nozzles are disposed over the second intervals and parallel to the axes of the solid rollers.

As embodied and broadly described herein, the first and the second intervals are alternatively disposed. Additionally, every row of the second etchant nozzles comprises several etchant nozzles and the etchant nozzles spray an etchant with an angle in the corresponding first intervals to form an etchant flux parallel to the axes of the solid rollers. The etchant flux flows from one end of the first interval corresponding to the axis of the solid roller to the other end of the first interval corresponding to the axis of the solid roller. Alternatively, the etchant flux flows from a central portion of the first interval corresponding to the axis of the solid roller to the margin of the first interval corresponding to the axis of the solid roller. Moreover, the the etchant flux in the adjacent first intervals flows in different directions.

Since the solid rollers touch the double-sided board, the etchant sprayed from the rows of the etchant nozzles can uniformly cover the double-sided board. Incidentally, the flux in the adjacent etchant spraying regions flows in different directions, so that the etchant may not agglomerate to manifest the fountain effect. Hence, the thickness of the etchant film on the double-sided board can be effectively decreased and the etching result of the double-sided board can be greatly improved.

Additionally, in some first intervals, the etchant flux flows from the central part to the margin of the first interval corresponding to the solid rollers, so that the thickness of the etchant film in the central part is decreased and the fountain effect can be avoided. Moreover, because air is puffed from the air nozzles sweeping over the double-sided board in the second intervals, the used etchant can be quickly removed. Therefore, the reaction probability between a conductive layer of the double-sided board and the fresh etchant is greatly increased. By sweeping away the etchant, the fountain effect can be avoided and the etching uniformity of the conductive layer is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
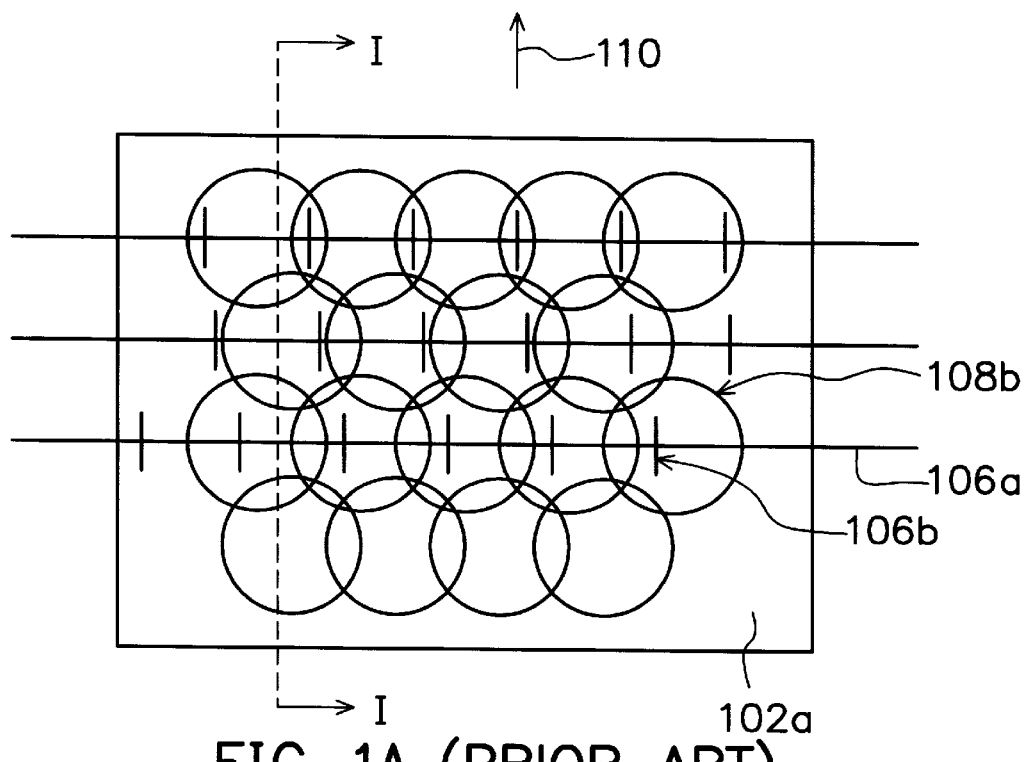
FIG. 1A is a schematic, top view of a double-sided board when copper layers on both sides of the insulating layer are converted into circuit layers by using a conventional etching device.
Figure 1B:
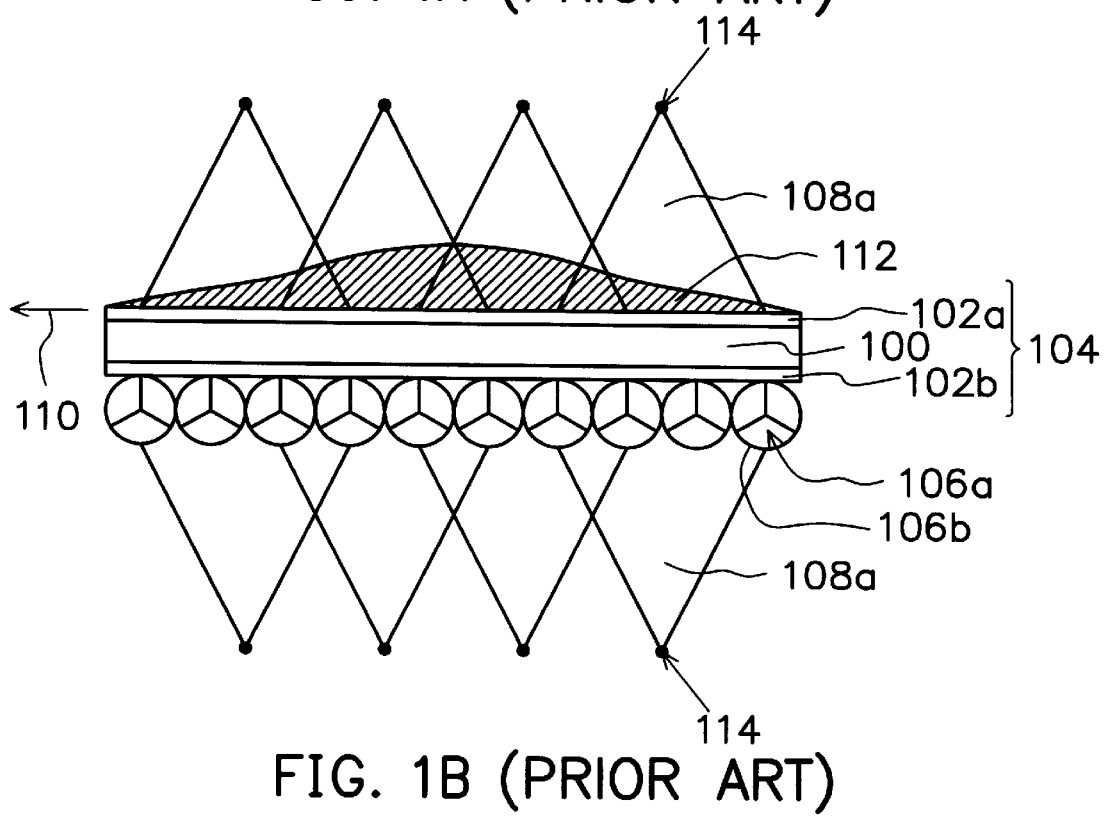
FIG. 1B is a cross-sectional view along a line I—I in FIG. 1A.
Figure 2:
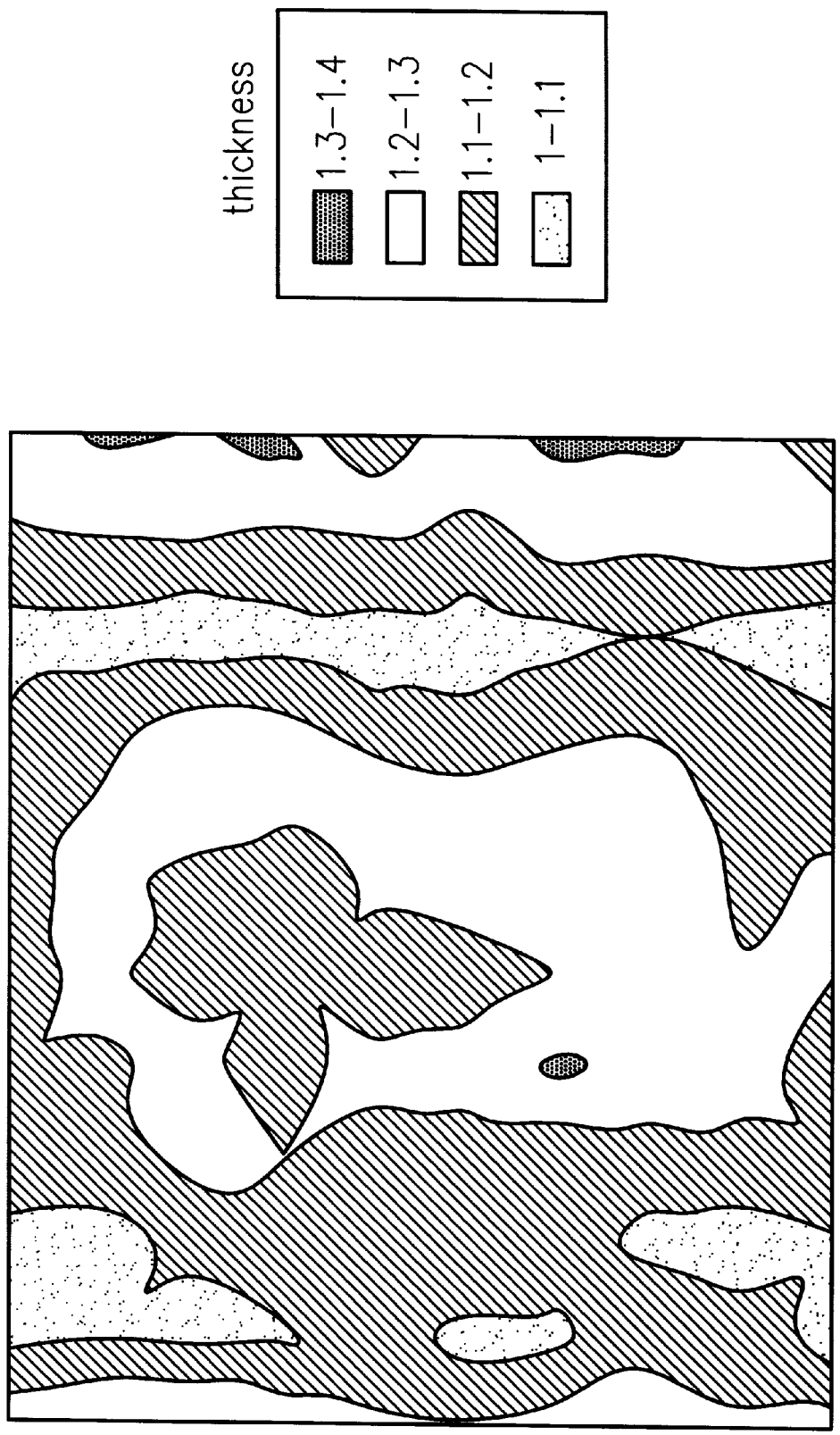
FIG. 2 is a contour diagram of the copper layer 102a after the etching process is performed.
Figure 3:
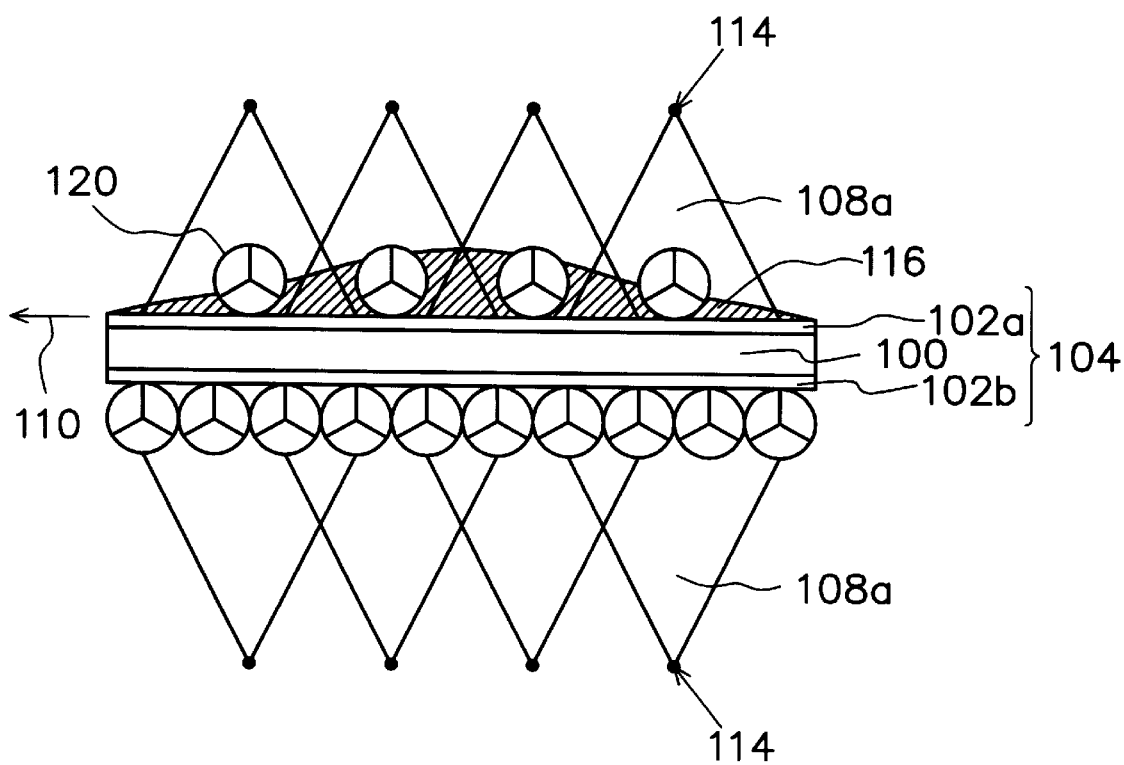
FIG. 3 is a cross-sectional view of another conventional etching device while an etching process is performed.
Figure 4A:
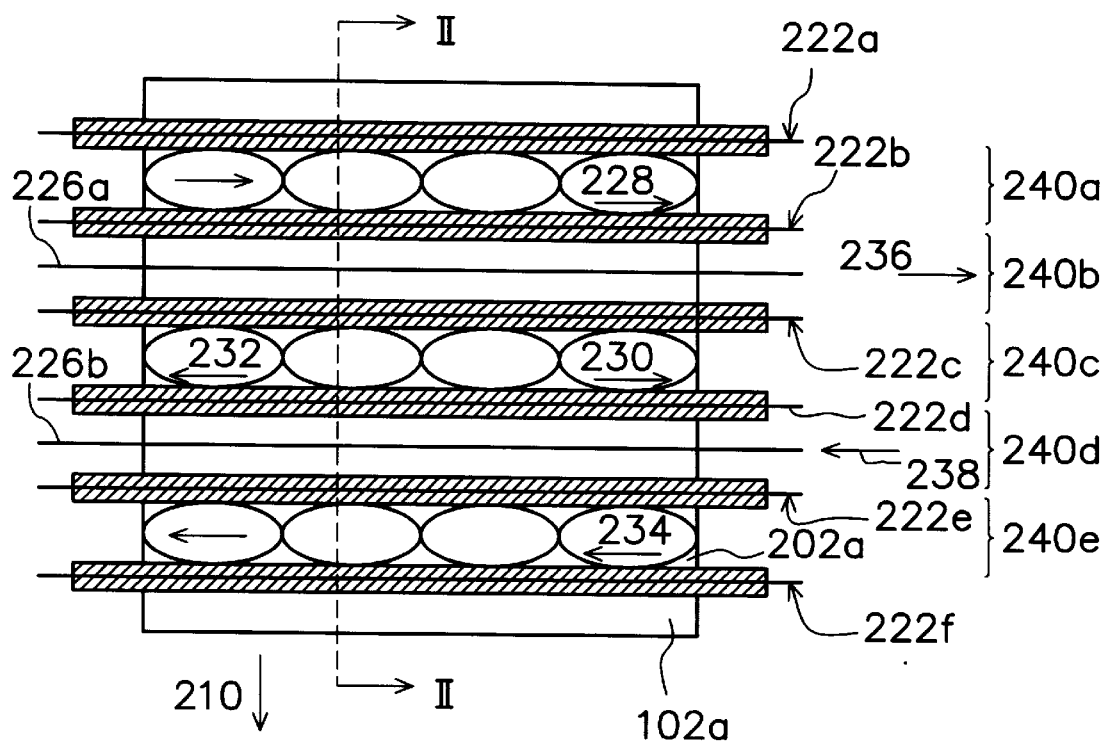
FIG. 4A is a schematic, top view of an etching device according to the invention with a double-sided board when conductive layers of the double-sided board are converted into circuit layers by performing an etching process.
Figure 4B:
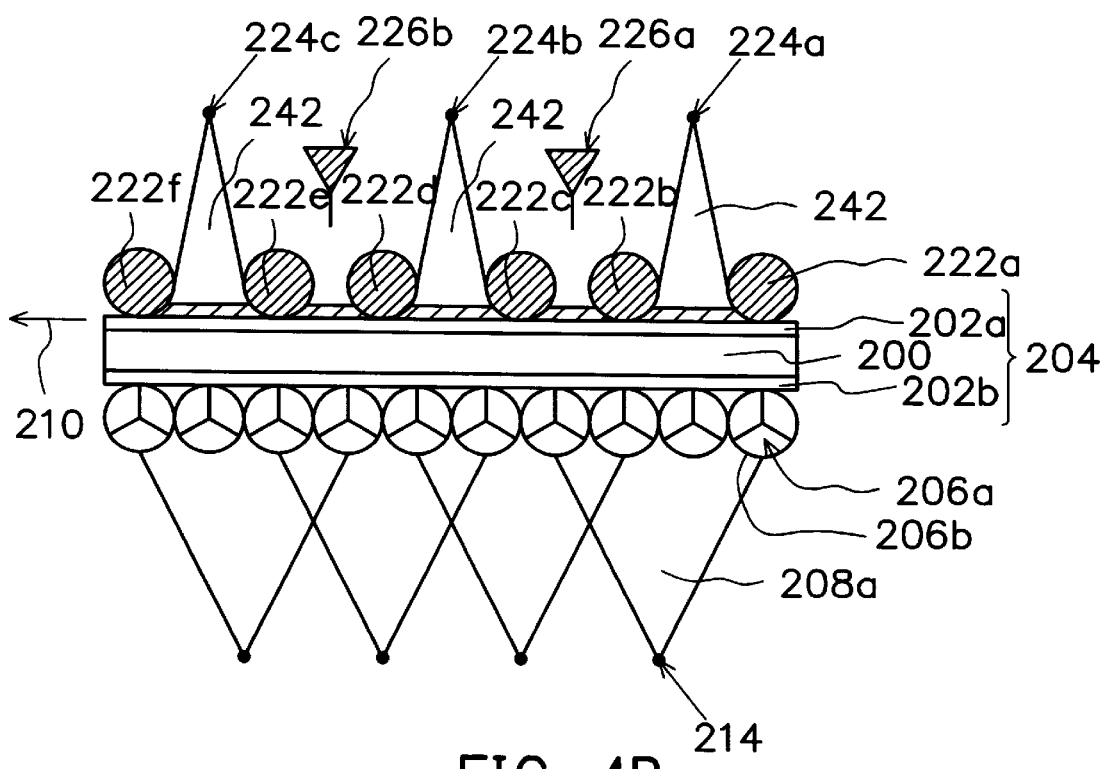
FIG. 4B is a cross-sectional view along a line II—II in FIG. 4A.

FIG. 4A is a schematic, top view of an etching device according to the invention with a double-sided board when conductive layers of the double-sided board are converted into circuit layers by performing an etching process. FIG. 4B is a cross-sectional view along a line II—II in FIG. 4A.

As shown in FIG. 4A together with FIG. 4B, a double-sided board 204 comprising alternating layers of an insulating layer 200 and conductive layers 202a and 202b is provided. After performing a photolithography process, a wet etching process is performed to pattern the conductive layers 102a and 102b. The double-sided board 204 can be a hard substrate and the insulating layer 200 can be made of bismaleimidetriazine (BT), FR-4 or FR-5 (flame-retardant epoxy-glass fabric composite resin), for example. Moreover, the conductive layers 202a and 202b can be made of copper, for example.

The etching device according to the invention comprises several hollow sheet-type rollers 206b, several solid rollers (222a, 222b, 222c, 222d, 222e and 222f), several rows of etchant nozzle 214, 224a, 224b and 224c and several rows of air nozzles 226a and 226b. Every row of the etchant nozzles comprises several etchant nozzles and every row of the air nozzles comprises several air nozzles.

In the wet etching process, the double-sided board 204 is supported by the hollow sheet-type rollers 206b and touches the hollow sheet-type rollers 206b through the conductive layer 202b. While the wet etching process is performed, the hollow sheet-type rollers 206b are driven to roll by axles 206a and the double-sided board 204 levelly moves in a direction indicated by an arrow 210.

The solid rollers 222a, 222b, 222c, 222d, 222e and 222f are disposed in the same plane on the conductive layer 202a. Each axis of the solid roller is perpendicular to the motion direction 210 of the double-sided board 204 and the axes of the solid rollers are parallel to each other. The solid rollers are used to smooth the subsequently formed etchant film, so that the etchant film can evenly cover the double-sided board 204. The solid rollers can be made of a soft material, for example.

Taking the solid rollers 222a, 222b, 222c, 222d, 222e and 222f as a basis for division, the space over the double-sided board 204 is divided into etchant spraying regions 240a, 240c and 240e (the first interval) and air knife regions 240b and 240d (the second interval). The etchant spraying regions 240a, 240c and 240e are respectively located between the solid rollers 222a and 222b, between the solid rollers 222c and 222d and between the solid rollers 222e and 222f (as shown in FIG. 4A). Moreover, the air knife regions 240b and 240d are respectively located between the solid rollers 22b and 222c and between the solid rollers 222d and 222e (as shown in FIG. 4A). pecifically, the space over the double-sided board 204 comprises the alternating regions of the etchant spraying regions (those are the etchant spraying regions 240a, 240c and 240e) and the air knife regions (air knife regions 240b and 240d).

The etchant spraying regions 240a, 240c and 240e respectively comprise the rows of the etchant nozzles 224a, 224b and 224c. The air knife regions 240b and 240d respectively comprise the rows of the air nozzles 226a and 226b. In other words, the rows of the etchant nozzles (224a, 224b and 224c) are alternatingly disposed with the rows of the air nozzles (226a and 226b). Furthermore, the etchant nozzles 214 are located under the conductive layer 202b of the double-sided board 204 to perform the etching process on the conductive layer 202b.

During the etching process, the row of the etchant nozzles 224a sprays etchant 242 with a specific angle onto the conductive layer 202a in the etchant spraying region 240a. Therefore, the etchant sprayed onto the conductive layer 202a forms a flux flowing in a direction indicated by an arrow 228 and parallel to the axes of the solid rollers 224a and 224b.

Similarly, in the etchant spraying region 240e, the row of the etchant nozzles 224c sprays etchant 242 with a specific angle onto the conductive layer 202a, so that the etchant sprayed onto the conductive layer 202a forms a flux flowing in a direction indicated by an arrow 234 and parallel to the axes of the solid rollers 224e and 224f.

Meanwhile, in the etchant spraying region 240c, the row of the etchant nozzles 224b sprays etchant 242 with a specific angle onto the conductive layer 202a. Hence, the etchant sprayed onto the conductive layer 202a forms a flux flowing from the central portion of the double-sided board 204 to the margins of the double-sided board 204 in directions respectively indicated by arrows 232 and 230 and parallel to the axes of the solid rollers 224c and 224d. Specifically, the the etchant flux in the adjacent etchant spraying regions flows in different directions.

Air is puffed from the row of the air nozzles 226a with a specific angle in the air knife region 240b onto the conductive layer 202a to form air current sweeping over the conductive layer 202a in a direction indicated by an arrow 236 and parallel to the axes of the solid rollers 224b and 224c. Identically, air is puffed from the row of the air nozzles 226b with a specific angle in the air knife region 240d onto the conductive layer 202a to form air current sweeping over the conductive layer 202a in a direction indicated by an arrow 238 and parallel to the axes of the solid rollers 224d and 224e. It should be noted that the air currents in the adjacent air knife regions flow in different directions.

Moreover, the direction of the air current in the air knife region 240b is the same as that of the flux in the etchant spraying region 240a. Furthermore, the direction of the air current in the air knife region 240d is the same as that of the flux in the etchant spraying region 240e. However, it is unnecessary to make the direction of the air current in the air knife region the same as that of the flux in the etchant spraying region. The direction of the air current only needs to smoothly remove the etchant from the double-sided board 204.

Since the solid rollers 222a, 222b, 222c, 222d, 222e and 222f are disposed on the conductive layer 202a of the double-sided board 204 and the double-sided board 204 is levelly moved by the hollow sheet-type rollers 206b, the etchant 242 sprayed from the rows of the etchant nozzles 224a, 224b and 224c can uniformly cover the conductive layer 202a. Incidentally, the flux in the adjacent etchant spraying regions flows in different directions, so that the etchant 242 may not agglomerate to manifest the fountain effect. Hence, the thickness of the etchant film on the conductive layer 202a can be effectively decreased and the etching result of the conductive layer 202a can be greatly improved.

Additionally, in the etchant spraying region 240c, the etchant flux flows from the central portion of the double-sided board 204 to the margins of the double-sided board 204, so that the thickness of the etchant film in the central portion is decreased and the fountain effect can be avoided. Moreover, because of the air currents sweeping over the conductive layer 202a in the air knife regions 226a and 226b, the etchant which has reacted with the conductive layer 202a can be quickly removed. Therefore, the reaction probability between the conductive layer 202a and the fresh etchant is greatly increased. By sweeping away the etchant, the fountain effect can be avoided and the etching uniformity of the conductive layer is improved.

Figure 5:
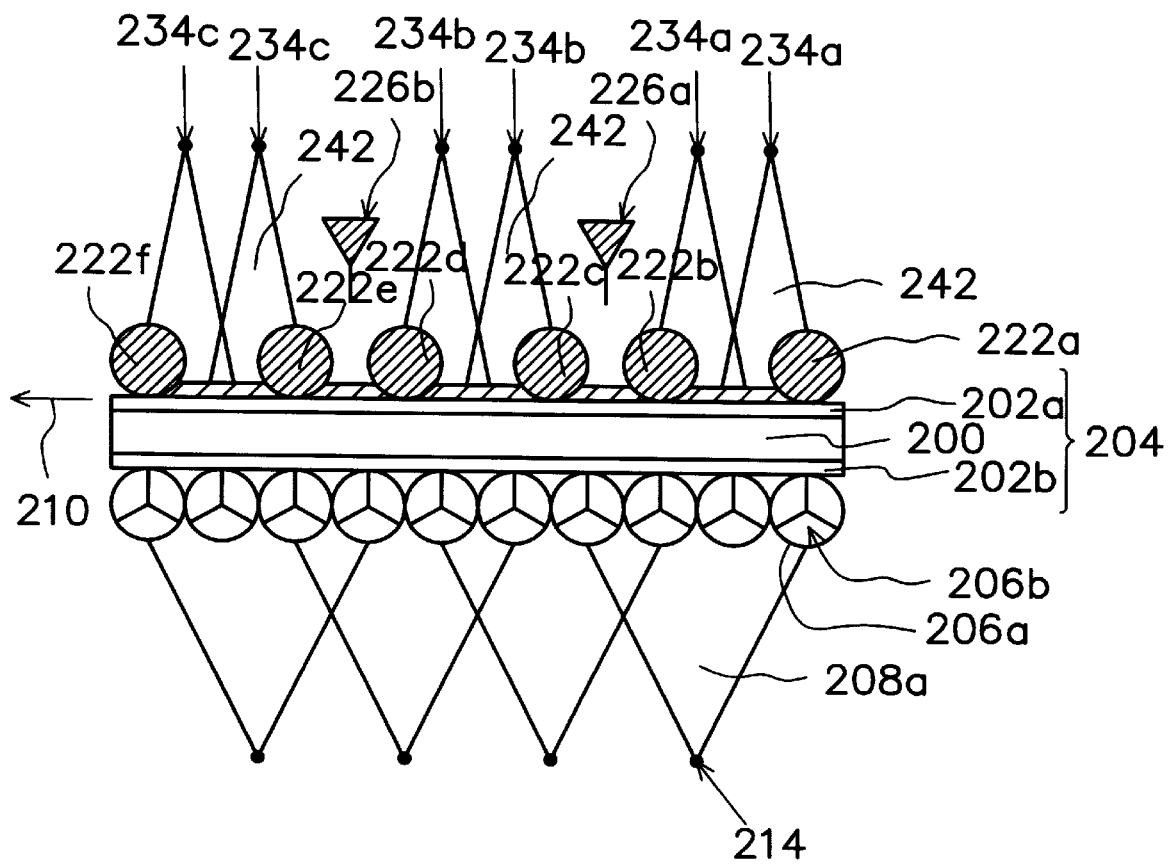
FIG. 5 is a cross-sectional view of another etching device according to the invention while an etching process is performed.

In the present embodiment, every etchant spraying region comprises a row of the etchant nozzles (as shown in FIG. 4B). However, in the application, every etchant spraying region can comprise more than two rows of the etchant nozzles (as shown in FIG. 5, the etchant nozzles 234a, 234b and 234c).

The embodiment according to the invention is one of the preferred etching devices. People skilled in the art may know that the combination of the etchant spraying regions and the air knife regions in the invention can be also reorganized to achieve the goal and the spirit of the invention. The preferable rule for combination of the etchant spraying regions and the air knife regions in the invention is that the rows of the etchant spraying nozzles and the row of the air nozzles are alternatingly and respectively disposed over the interval between the solid rollers. Additionally, the rows of the etchant spraying nozzles and the rows of the air nozzles are parallel to the axes of the solid rollers. Preferably, the etchant flux in the adjacent etchant spraying regions flow in different directions. Moreover, the air currents in the adjacent air knife regions flow in different directions. Incidentally, the direction of the etchant flux in the etchant spraying region is not limited by the embodiment and the direction of the etchant flux; all that is required is that the rule that the etchant flux in adjacent etchant spraying regions flows in different directions be followed in order to smoothly remove the used etchant.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An etching device capable of forming a uniform etchant film, the etching device disposed on a plurality of parallel and coplanar hollow rollers used to support a double-sided board, wherein a plurality of first etchant nozzles is disposed under the hollow rollers, the device comprising:

a plurality of solid rollers coplanarly disposed over the hollow rollers and parallel to each other, wherein adjacent solid rollers comprise an interval, the intervals are divided into a plurality of first intervals and a plurality of second intervals and the solid rollers touch the double-sided board to make an etchant film covering the double-sided board more uniform;

a plurality of rows of second etchant nozzles disposed over the first intervals and parallel to axes of the solid rollers; and a plurality of rows of air nozzles disposed over the second intervals and parallel to the axes of the solid rollers.

2. The etching device of claim 1, wherein the first and the second intervals are alternatively disposed.

3. The etching device of claim 1, wherein every row of the second etchant nozzles comprises several etchant nozzles and the etchant nozzles spray an etchant with an angle in their corresponding first intervals to form an etchant flux parallel to the axes of the solid rollers.

4. The etching device of claim 3, wherein the etchant flux flows from one end of the first interval corresponding to the axis of the solid roller to the other end of the first interval corresponding to the axis of the solid roller.

5. The etching device of claim 3, wherein the etchant flux flows from a central portion of the first interval corresponding to the axis of the solid roller to a margin of the first interval corresponding to the axis of the solid roller.

6. The etching device of claim 3, wherein the etchant flux in adjacent first intervals flows in different directions.

7. The etching device of claim 1, wherein every row of the air nozzles comprises several air nozzles and the air nozzles puff air with an angle in the corresponding second intervals to sweep away the etchant on the double-sided board.

8. The etching device of claim 1, wherein each row of the second etchant nozzles is disposed over each first interval.

9. The etching device of claim 1, wherein each of the first intervals comprises two rows of the second etchant nozzles.

10. An etching device suitable for an etching process of a double-sided board, the etching device comprising:

a plurality of parallel and coplanar hollow rollers used to support the double-sided board, wherein a plurality of first etchant nozzles is disposed under the hollow rollers;

a plurality of solid rollers coplanarly disposed over the hollow rollers and parallel to each other, wherein adjacent solid rollers comprise an interval and the solid rollers touch the double-sided board to make an etchant film covering the double-sided board more uniform; and a plurality of rows of second etchant nozzles disposed over the intervals and parallel to axes of the solid rollers a plurality of rows of air nozzles respectively disposed over second intervals and parallel to the axes of the solid rollers.

11. The etching device of claim 10, wherein the intervals are divided into a plurality of first intervals comprising the rows of the second etchant nozzles and a plurality of second intervals comprising a plurality of rows of the air nozzles, and the rows of the air nozzles are disposed over the second intervals and parallel to the axes of the solid rollers, and the first and the second intervals are alternatingly disposed.

12. The etching device of claim 11, wherein every row of the air nozzles comprises several air nozzles and the air nozzles puff air with an angle in corresponding second intervals to sweep away the etchant on the double-sided board.

13. The etching device of claim 11, wherein each row of the second etchant nozzles is disposed over each first interval.

14. The etching device of claim 11, wherein each of the first intervals comprises two rows of the second etchant nozzles.

15. The etching device of claim 11, wherein every row of the second etchant nozzles comprises several etchant nozzles and the etchant nozzles spray an etchant with an angle in corresponding intervals to form an etchant flux parallel to the axes of the solid rollers.

16. The etching device of claim 15, wherein the etchant flux flows from one end of an interval corresponding to the axis of the solid roller to the other end of the interval corresponding to the axis of the solid roller.

17. The etching device of claim 15, wherein the etchant flux flows from a central portion of an interval corresponding to the axis of the solid roller to a margin of the interval corresponding to the axis of the solid roller.

18. The etching device of claim 15, wherein the etchant flux in adjacent intervals flows in different directions.

* * * * *